United States Patent
Maulik

(10) Patent No.: US 7,139,326 B2
(45) Date of Patent: Nov. 21, 2006

(54) IMAGE-CANCELING QUADRATURE MODULATOR AND METHOD

(75) Inventor: Prabir Maulik, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 795 days.

(21) Appl. No.: 09/952,832

(22) Filed: Sep. 14, 2001

(65) Prior Publication Data

US 2003/0053556 A1 Mar. 20, 2003

(51) Int. Cl.
*H04K 1/02* (2006.01)
*H04L 25/49* (2006.01)

(52) U.S. Cl. .................. 375/296; 375/298; 375/285

(58) Field of Classification Search .......... 375/296, 375/298, 259, 261, 232, 235, 297; 348/426.1, 348/384.1, 433.1, 384; 455/302
See application file for complete search history.

(56) References Cited

U.S. PATENT DOCUMENTS

| | | | | |
|---|---|---|---|---|
| 4,688,096 A | * | 8/1987 | Campbell et al. ........... 348/614 |
| 4,794,556 A | * | 12/1988 | Rader .......................... 708/320 |
| 4,866,521 A | * | 9/1989 | Hurst, Jr. .................. 348/436.1 |
| 5,101,418 A | * | 3/1992 | Critchlow et al. .......... 375/260 |
| 5,293,406 A | * | 3/1994 | Suzuki ........................ 375/295 |
| 5,355,101 A | * | 10/1994 | Ichihara et al. ............. 332/103 |
| 5,469,469 A | * | 11/1995 | Haines ........................ 375/131 |
| 5,797,847 A | * | 8/1998 | Miller et al. ................ 600/447 |
| 5,825,242 A | * | 10/1998 | Prodan et al. ............... 329/304 |
| 6,347,325 B1 | * | 2/2002 | Ribner et al. ................ 708/271 |
| 6,665,355 B1 | * | 12/2003 | Chen et al. .................. 375/321 |
| 6,714,776 B1 | * | 3/2004 | Birleson ...................... 455/302 |

OTHER PUBLICATIONS

Paul O'Leary and Franco Maloberti, "A Direct-Digital Synthesizer with Improved Spectral Performance", IEEE Transactions on Communications, vol. 39, Jul. 7, 1991, pp. 1046-1048.*
Shoji Otaka et al., "A low Local Input Power 1.9 GHz Si-Bipolar Quadrature Modulator without any Adjustment", IEEE Bipolar/BiCMOS Circuits and Technology Meeting 1994, pp. 171-174.*
B. Razavi, *RF Microelectronics*, pp. 138-147, Prentice Hall, NJ, 1998.

* cited by examiner

*Primary Examiner*—Jean B. Corrielus
*Assistant Examiner*—Qutub Ghulamali
(74) *Attorney, Agent, or Firm*—Iandiorio & Teska

(57) ABSTRACT

Canceling images in a quadrature modulator includes frequency shifting the baseband signal and images; filtering the frequency shifted baseband signal and images; phase and frequency shifting the baseband signal and images; filtering the phase and frequency shifted baseband signal and images; combining the filtered frequency shifted baseband signal and images with the filtered phase and frequency shifted baseband signal and images to suppress the negative frequency images and isolate the modulated baseband signal.

35 Claims, 5 Drawing Sheets

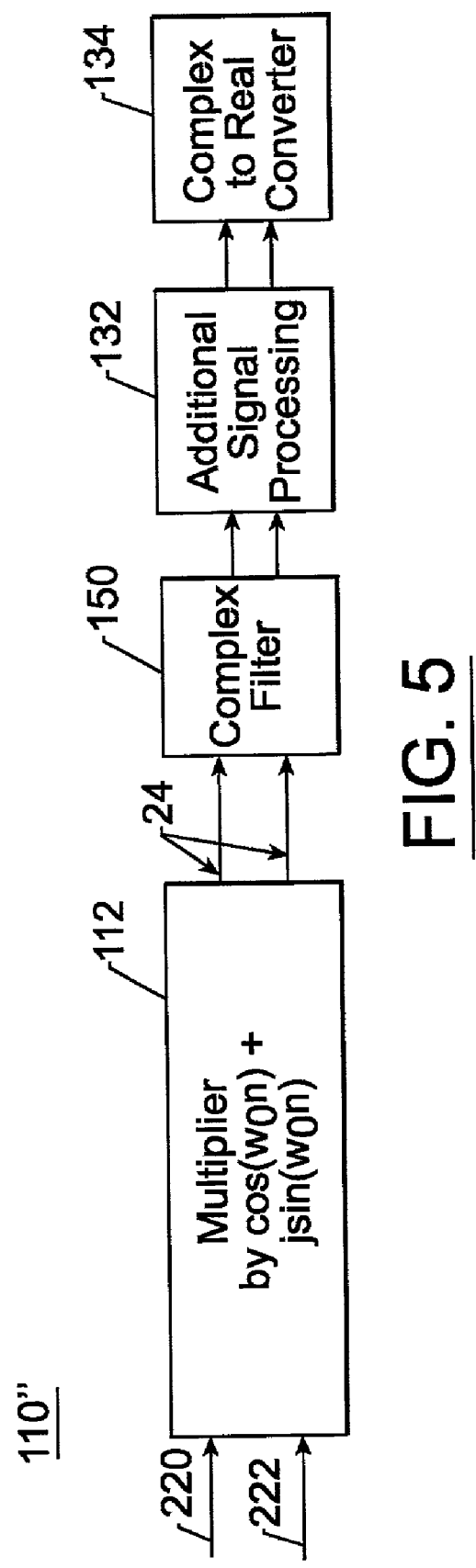

IMAGE-CANCELING QUADRATURE MODULATOR AND METHOD

FIELD OF THE INVENTION

This invention relates to an image-canceling quadrature modulator for use in digital communication systems.

BACKGROUND OF THE INVENTION

Digital communication systems frequently require quadrature modulation of complex baseband signals. Quadrature modulation usually involves multiplication with a complex exponential and subsequently extracting the real part of the complex product for transmission into the medium. The extraction of the real part might cause a negative frequency image to corrupt the main signal. This negative frequency image can be, for example, a sampling image caused by a prior upsampling step in the digital domain.

One way to reduce this problem is to have sufficient filtering of the image. But this is usually a costly approach.

SUMMARY OF THE INVENTION

It is therefore an object of this invention to provide an image-canceling quadrature modulator to cancel the effect of images during quadrature modulation.

It is a further object of this invention to provide such an image-canceling modulator which is less expensive.

The invention results from the realization that truly improved, more effective quadrature modulation can be achieved without expensive filtering by frequency shifting the baseband signal with its images, phase and frequency shifting the baseband signal and images, filtering the two frequency shifted signals and combining the outputs of the two filters to suppress the negative frequency images and isolate the modulated baseband signal.

This invention features an image canceling quadrature modulator including a first complex modulator responsive to a complex carrier signal for frequency shifting the baseband signal and images and a second complex modulator responsive to the complex carrier signal for phase and frequency shifting the baseband signal and images. A first filter responsive to the frequency shifted signal from the first complex modulator filters the frequency shifted signal. A second filter responsive to the phase and frequency shifted signal from the second complex modulator filters the phase and frequency shifted signals. A combiner circuit combines the outputs of the two filters thus suppressing the negative frequency images and isolating the modulated baseband signal.

In a preferred embodiment the first complex modulator may multiply the baseband signal and images by a complex function. The first complex modulator may multiply the baseband signal and images by a complex exponential signal. The first complex modulator may multiply the baseband signal and images by a complex exponential signal $e^{j\omega_0 n}=\cos(\omega_0 n)+j\sin(\omega_0 n)$ or $e^{j\omega_0 t}=\cos(\omega_0 t)+j\sin(\omega_0 t)$. The second complex modulator may multiply the baseband signal and images by a complex signal. The second complex modulator may multiply the baseband signal and images by a phase-shifted complex exponential signal. The second complex modulator may multiply the baseband signal and images by a phase shifted complex exponential signal $e^{j\omega_0 n} \cdot e^{-j\pi/2}=\sin(\omega_0 n)-j\cos(\omega_0 n)$ or $e^{j\omega_0 t} \cdot e^{-j\pi/2}=\sin(\omega_0 t)-j\cos(\omega_0 t)$. The first filter may include a delay. The second filter may include a Hilbert transform filter.

The invention also features a method for canceling negative frequency images in a complex signal including frequency shifting the baseband signal and the images; phase and frequency shifting the baseband signal and images; filtering the outputs of the two frequency shifters and combining the outputs of the two filters to suppress the negative frequency images and isolate the modulated baseband signal.

In a preferred embodiment the frequency shifting may be performed by multiplying the complex signal by a complex signal. The complex signal may be a complex exponential signal. The complex exponential signal may be $e^{j\omega_0 n}=\cos(\omega_0 n)+j\sin(\omega_0 n)$ or $e^{j\omega_0 t}=\cos(\omega_0 t)+j\sin(\omega_0 t)$. The phase and frequency shifting may be performed by multiplying the complex signal by a complex signal. The complex signal may be a phase-shifted complex exponential signal. The phase-shifted complex exponential signal may be $e^{j\omega_0 n} \cdot e^{-j\pi/2}=\sin(\omega_0 n)-j\cos(\omega_0 n)$ or $e^{j\omega_0 t} \cdot e^{-j\pi/2}=\sin(\omega_0 t)-j\cos(\omega_0 t)$. The first filtering may perform a delay on the frequency shifted signal. The second filtering may perform a Hilbert transformation on the phase and frequency shifted signals.

This invention also features an image-canceling quadrature modulator including a complex modulator responsive to a complex carrier signal, the complex carrier signal including a baseband signal and images, for frequency shifting the baseband signal and images. First and second filters responsive to the frequency shifted baseband signal and images from the complex modulator filter the frequency shifted signal. A phase shifting circuit responsive to the frequency shifted filtered baseband signal and images from the second filter phase shifts the frequency shifted filtered signal. A combiner circuit combines the frequency shifted filtered baseband signal and images from said first filter with the phase and frequency shifted filtered baseband signal and images from said phase shifting circuit for suppressing the images and isolating the modulated baseband signal.

This invention also features an image-canceling quadrature modulator including a complex modulator responsive to a complex carrier signal, the complete carrier signal including a baseband signal and images, for frequency shifting the baseband signal and images. A first filter responsive to the frequency shifted baseband signal and images from the complex modulator filters the frequency shifted signal. A phase shifting circuit responsive to the frequency shifted baseband signal and images from the complex modulator phase shifts the frequency shifted signal. A second filter responsive to the phase and frequency shifted baseband signal and images from said phase shifting circuit filters the phase and frequency shifted signal. A combiner circuit combines the frequency shifted filtered baseband signal and images from said first filter with the phase and frequency shifted baseband signal and images from said second filter for suppressing the images and isolating the modulated baseband signal.

This invention also features an image-canceling quadrature modulator including a complex modulator responsive to a complex carrier signal, the complex carrier signal including a baseband signal and images, for frequency shifting the baseband signal and images; and a complex filter responsive to the frequency shifted baseband signal and images from the complex modulator for attenuating negative frequencies in the frequency shifted baseband signal and images.

BRIEF DESCRIPTION OF THE DRAWINGS

Other objects, features and advantages will occur to those skilled in the art from the following description of a preferred embodiment and the accompanying drawings, in which:

FIG. 5 is a block diagram of another embodiment of a digital modulator according to the present invention.

DESCRIPTION OF THE PREFERRED EMBODIMENTS

Figure 1:
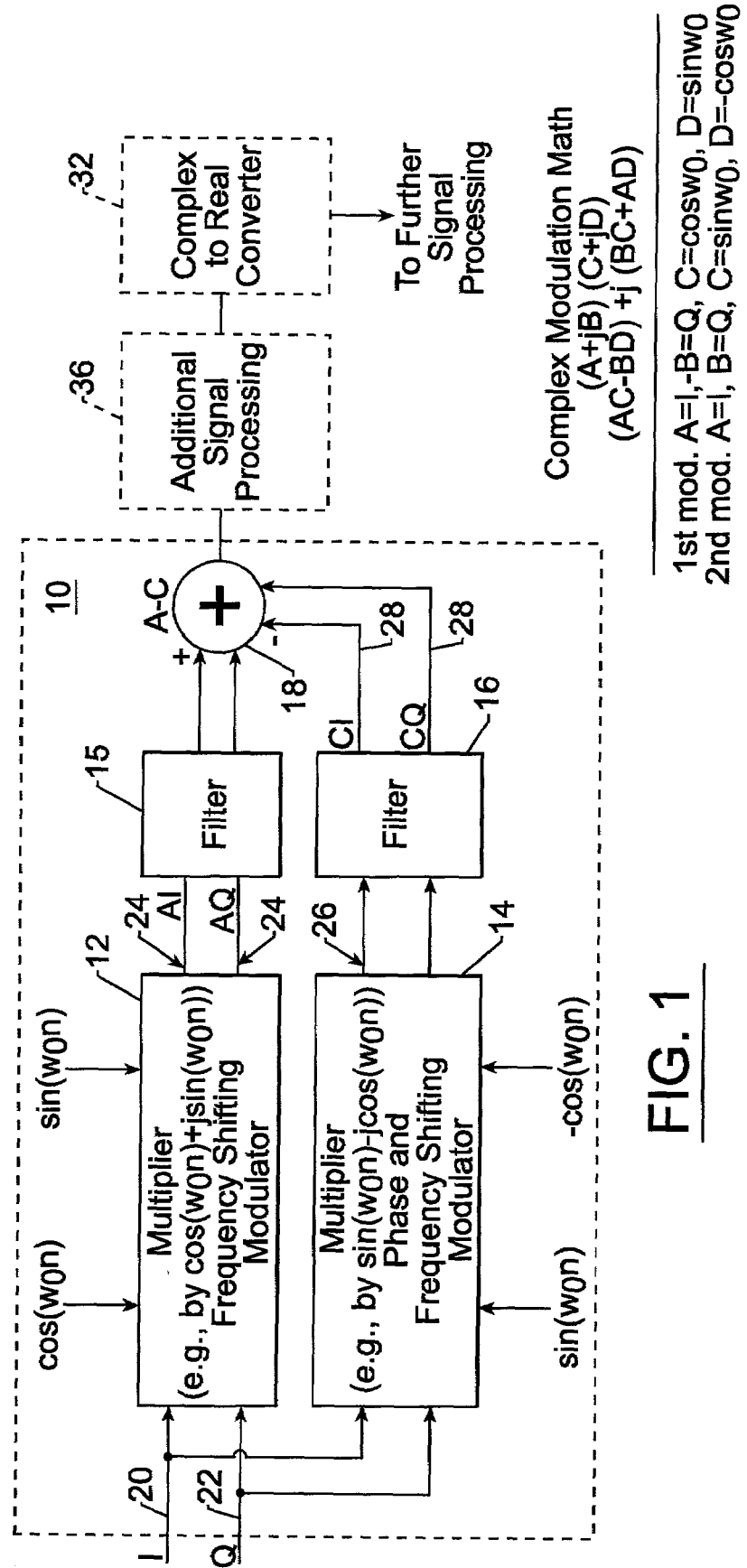
FIG. 1 is a block diagram of a digital modulator according to the present invention.

Image-canceling quadrature modulator 10, FIG. 1, includes first complex modulator 12, second complex modulator 14, first and second filters 15, 16 and combiner circuit 18. A complex signal is represented by signals 20, 22. This complex signal contains the baseband signal as well as images.

First complex modulator 12 frequency shifts signals 20, 22 by multiplying the signals by a complex signal. That complex signal may be a complex exponential signal. In a preferred embodiment, that complex exponential signal may be $e^{j\omega_0 n}=\cos(\omega_0 n)+j\sin(\omega_0 n)$, or $e^{j\omega_0 t}=\cos(\omega_0 t)+j\sin(\omega_0 t)$, where $\omega_0$ is a carrier frequency.

Second complex modulator 14 phase and frequency shifts the complex signal represented by 20, 22 by multiplying the signal by a complex signal. That complex signal may be a phase shifted complex exponential signal. In a preferred embodiment, that phase-shifted complex exponential signal may be $e^{j\omega_0 n}e^{-j\pi/2}=\sin(\omega_0 n)-j\cos(\omega_0 n)$ or $e^{j\omega_0 t}\cdot e^{-j\pi/2}=\sin(\omega_0 t)-j\cos(\omega_0 t)$.

Signal 24 from first complex modulator is filtered by filter 15. Filter 15 may include a delay.

Signal 26 from second complex modulator 14 is filtered by filter 16. Filter 16 may be a Hilbert transform filter.

Combiner circuit 18 combines the outputs of filters 15 and 16. This combination suppresses the negative frequency images and isolates the frequency-shifted baseband signal. The isolated frequency-shifted baseband signal may go through additional signal processing, 36, and then goes through complex to real converter 32 to eliminate the imaginary part of the signal. The converted baseband signal may then be subject to further signal processing as appropriate.

Figure 3:
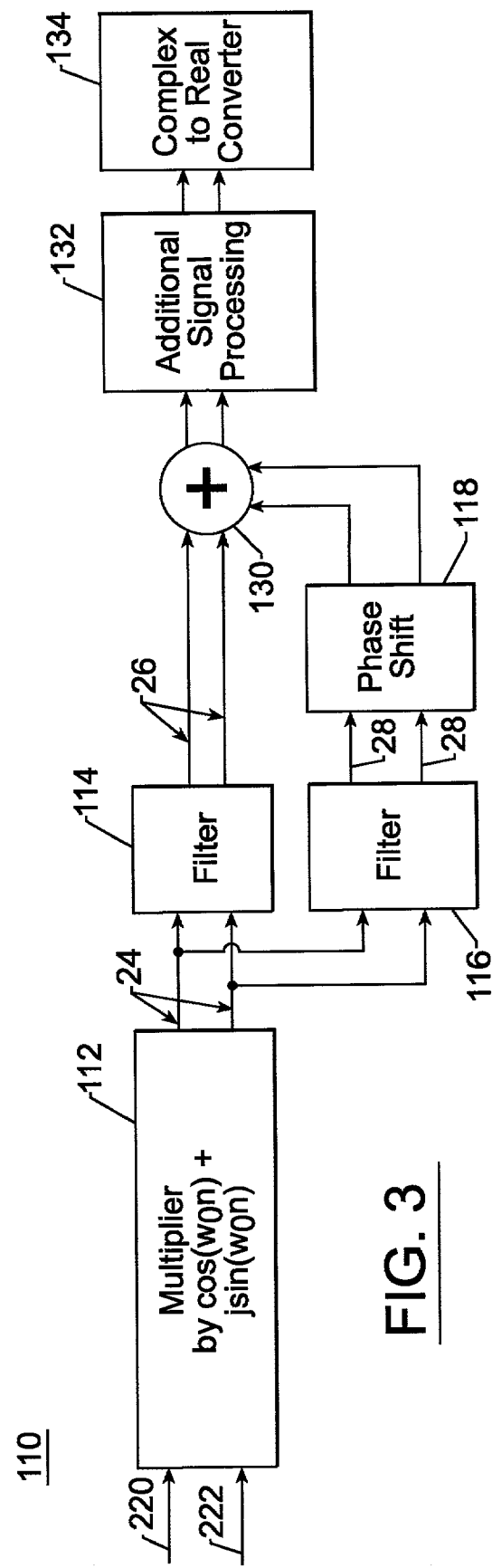
FIG. 3 is a block diagram of another embodiment of a digital modulator according to the present invention.

In one embodiment, image-canceling quadrature modulator 110, FIG. 3, includes complex modulator 112, first filter 114, second filter 116, phase shifting circuit 118 and combiner circuit 130. The complex signal contains the baseband signal and images.

Complex modulator 112 frequency shifts signals 220, 222 by multiplying the signals by a complex signal. That complex signal may be a complex exponential signal. In a preferred embodiment, that complex exponential signal may be $e^{j\omega_0 n}=\cos(\omega_0 n)+j\sin(\omega_0 n)$, or $e^{j\omega_0 t}=\cos(\omega_0 t)+j\sin(\omega_0 t)$, where $\omega_0$ is a carrier frequency.

First filter 114 filters the complex signal 24 from modulator 112. Filter 114 may include a delay. Second filter 116 also filters signal 24 from modulator 112. Filter 116 may be a Hilbert transform filter. Phase shifting circuit 118 phase shifts signal 28 from filter 116. The phase shifting circuit may shift the phase of the signal by 90°.

Combiner circuit 130 combines the outputs of filters 114 and phase shift block 118. This combination suppresses the negative frequency images and isolates the frequency-shifted baseband signal. The isolated frequency-shifted basebdand signal may go through additional signal processing, 36, and then goes through complex to real converter 32 to eliminate the imaginary part of the signal. The converted baseband signal may then be subject to further signal processing as appropriate.

Figure 4:
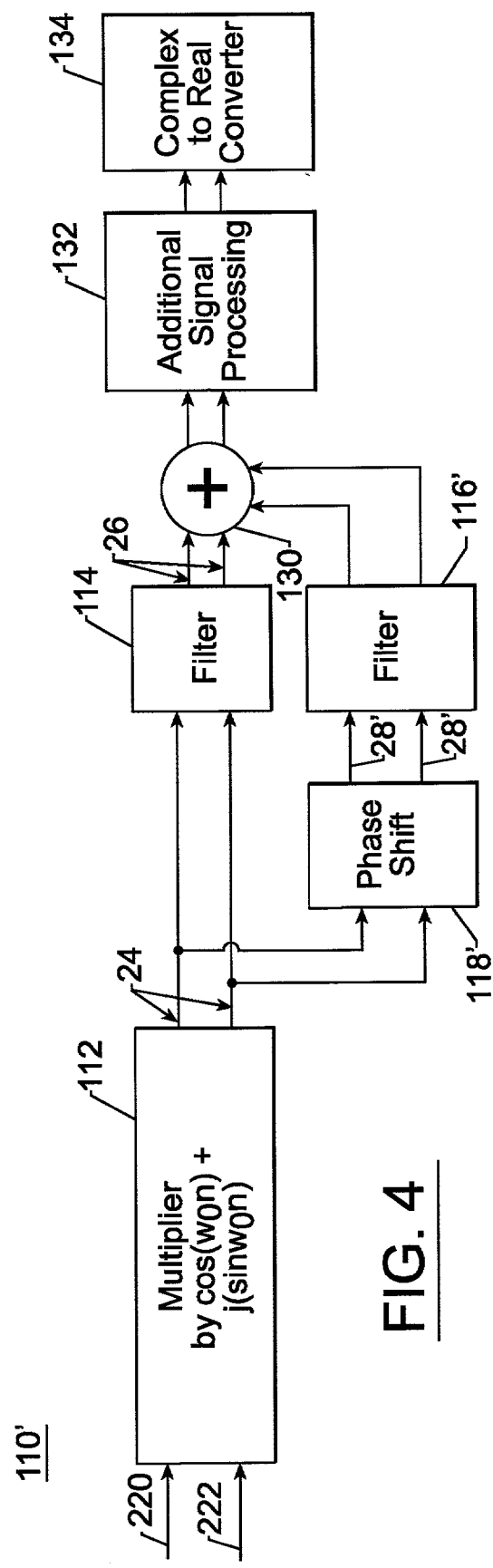
FIG. 4 is a clock diagram of another embodiment of a digital modulator according to the present invention.

In another embodiment, image-canceling quadrature modulator 110', FIG. 4, is similar to that shown in FIG. 3, with the difference that phase shifting circuit 118' phase shifts complex signal 24 from modulator 112 and filter 116' filters signal 28' from phase shifting circuit 118'. The phase shifting circuit may shift the phase of the signal by 90°.

In another embodiment, image-canceling quadrature modulator 110", FIG. 5, includes complex modulator 112 and complex filter 150. Complex filter 150 may attenuate negative frequencies from complex signal 24 from the modulator. The modulated and filtered signal may be subject to additional signal processing, 132, and then goes through complex to real converter 134 to eliminate the imaginary part of the signal. The converted baseband signal may then be subject to further signal processing as appropriate.

The invention also involves a method of accomplishing negative frequency image suppression. This method 50, FIG. 2, includes frequency shifting the baseband signal and images, step 52; filtering the frequency shifted signal and images, step 53; phase and frequency shifting the baseband signal and images, step 54; filtering the phase and frequency shifted signal and images, step 56; combining the outputs of the two filters to suppress the negative images and isolate the modulated baseband signal, step 58; and extracting the real part of the signal, step 59. Additional signal processing, step 61, may be performed between steps 58 and 59.

Figure 2:
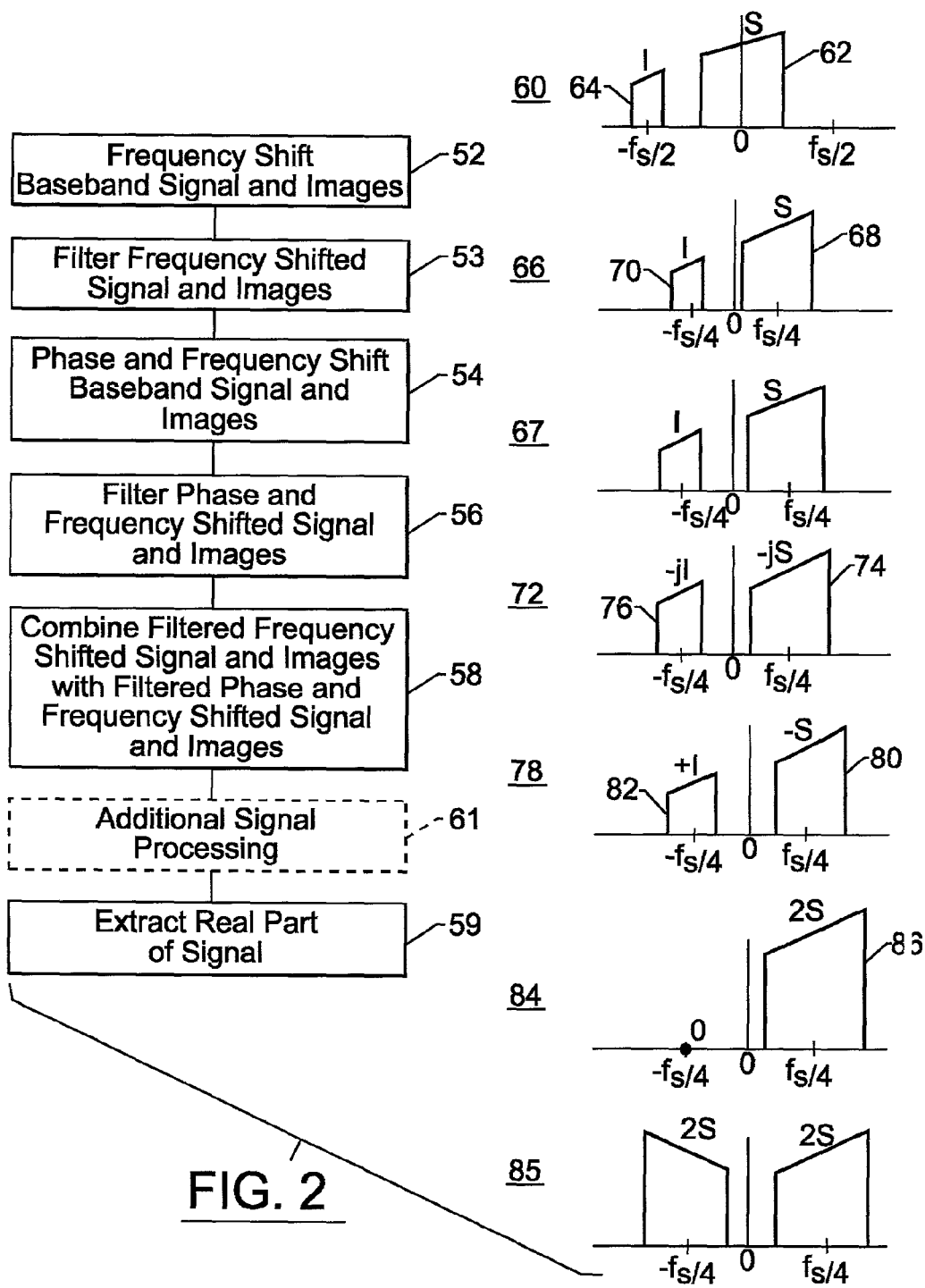
FIG. 2 is a block diagram of a method according to the present invention.

Complex digital signal 60, FIG. 2, represents, in the frequency domain, the baseband signals 62 and images 64 with negative frequencies to the left of zero and positive frequencies to the right of zero. Step 52 frequency shifts the baseband signals and the images as shown in frequency domain representation 66, including frequency shifted baseband signals 68 and frequency shifted images 70. In the preferred embodiment, first filtering step 53 merely delays the signal and does not change the frequency domain representation. Hence 67 is the same as 66.

Phase and frequency shifting step 54, produces frequency domain representation 72 which includes phase and frequency shifted baseband signals 74 and phase and frequency shifted images 76. Second filtering step 56 produces frequency domain representation 78 which includes filtered, phase and frequency shifted baseband signals 80 and filtered, phase and frequency shifted images 82.

Combining step 58 combines frequency domain representations 67 and 78, suppressing the negative frequency images and isolating the modulated baseband signal as shown by frequency domain representation 84, including isolated modulated baseband signal 86.

Frequency domain representation 85 shows the real part of frequency domain representation 84 after extraction step 59, by complex to real converter 32, FIG. 1. As shown, this real part of the signal has no interference from the modulated negative frequency images, as would be the case if one takes the real part of frequency domain representation 66.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

The invention claimed is:

1. An image-canceling quadrature modulator comprising:
   a first complex modulator responsive to a complex carrier signal, the complex carrier signal including a baseband signal and signal images for frequency shifting the baseband signal and signal images to generate frequency shifted baseband signal and signal images;
   a first filter responsive to the frequency shifted baseband signal and signal images from said first complex modulator to generate frequency shifted filtered baseband signal and signal images;
   a second complex modulator responsive to said complex carrier signal for phase and frequency shifting the baseband signal and signal images to generate phase and frequency shifted baseband signal and signal images;
   a second filter responsive to the phase and frequency shifted baseband signal and signal images from said second complex modulator to generate phase and frequency shifted filtered baseband signal and signal images; and
   a combiner circuit for combining the frequency shifted filtered baseband signal and signal images from said first filter with the phase and frequency shifted filtered baseband signal and signal images from said second filter for suppressing said signal images and isolating the frequency shifted baseband signal.

2. The image-canceling quadrature modulator of claim 1 wherein said first complex modulator multiplies the baseband signal and signal images by a complex signal.

3. The image-canceling quadrature modulator of claim 1 wherein said first complex modulator multiplies the baseband signal and signal images by a complex exponential signal.

4. The image-canceling quadrature modulator of claim 3 wherein said complex exponential signal is $e^{j\omega_0 n}=\cos(\omega_0 n)+j \sin(\omega_0 n)$, wherein $\omega_0$ is a carrier frequency.

5. The image-canceling quadrature modulator of claim 3 wherein said complex exponential signal is $e^{j\omega_0 t}=\cos(\omega_0 t)+j \sin(\omega_0 t)$, wherein $\omega_0$ is a carrier frequency.

6. The image-canceling quadrature modulator of claim 1 wherein said second complex modulator multiplies the baseband signal and signal images by a complex signal.

7. The image-canceling quadrature modulator of claim 1 wherein said second complex modulator multiplies the baseband signal and signal images by a phase-shifted complex exponential signal.

8. The image-canceling quadrature modulator of claim 7 wherein said phase-shifted complex exponential signal is $e^{j\omega_0 n} \cdot e^{-j\pi/2} = \sin(\omega_0 n) - j \cos(\omega_0 n)$, wherein $\omega_0$ is a carrier frequency.

9. The image-canceling quadrature modulator of claim 7 wherein said phase-shifted complex exponential signal is $e^{j\omega_0 t} \cdot e^{-j\pi/2} = \sin(\omega_0 t) - j \cos(\omega_0 t)$, wherein $\omega_0$ is a carrier frequency.

10. The image-canceling quadrature modulator of claim 1 wherein said first filter includes a delay.

11. The image-canceling quadrature modulator of claim 1 wherein said second filter is a Hilbert transform filter.

12. A method for canceling negative frequency signal images in a complex signal including a baseband signal and signal images, the method comprising:
   frequency shifting the baseband signal and the signal images to generate frequency shifted baseband signal and signal images, said frequency shifting performed by multiplying the complex signal by a complex exponential signal;
   filtering the frequency shifted baseband signal and signal images to generate filtered frequency shifted baseband signal and signal images;
   phase and frequency shifting the baseband signal and signal images to generate phase and frequency shifted the baseband signal and signal images;
   filtering the phase and frequency shifted signals to generate filtered phase and frequency shifted baseband signal and signal images; and
   combining the filtered frequency shifted baseband signal and signal images with the filtered phase and frequency shifted baseband signal and signal images to suppress said signal images and isolate the frequency shifted baseband signal.

13. The method of claim 12 wherein the frequency shifting is performed by multiplying the complex signal by a complex exponential signal, $e^{j\omega_0 n}=\cos(\omega_0 n)+j \sin(\omega_0 n)$, wherein $\omega_0$ is a carrier frequency.

14. The method of claim 12 wherein the frequency shifting is performed by multiplying the complex signal by a complex exponential signal, $e^{j\omega_0 t}=\cos(\omega_0 t)+j \sin(\omega_0 t)$, wherein $\omega_0$ is a carrier frequency.

15. The method of claim 12 wherein said filtering of frequency-shifted baseband signal and signal images is performed by delaying the frequency shifted baseband signal and signal images.

16. The method of claim 12 wherein said phase and frequency shifting is performed by multiplying the complex signal by a complex signal.

17. The method of claim 12 wherein said phase and frequency shifting is performed by multiplying the complex signal by a phase-shifted complex exponential signal.

18. The method of claim 17 wherein the phase-shifted complex exponential signal is $e^{j\omega_0 n} \cdot e^{-j\pi/2} = \sin(\omega_0 n) - j \cos(\omega_0 n)$, wherein $\omega_0$ is a carrier frequency.

19. The method of claim 17 wherein the phase-shifted complex exponential signal is $e^{j\omega_0 t} \cdot e^{-j\pi/2} = \sin(\omega_0 t) - j \cos(\omega_0 t)$, wherein $\omega_0$ is a carrier frequency.

20. The method of claim 12 wherein said filtering of the phase and frequency shifted baseband signal and signal images performs a Hilbert transformation on the phase and frequency shifted based signal and signal images.

21. An image-canceling quadrature modulator comprising:
   a complex modulator responsive to a complex carrier signal, the complex carrier signal including a baseband signal and signal images, for frequency shifting the baseband signal and signal images to generate frequency shifted baseband signal and signal images, said complex modulator multiplying the baseband signal and signal images by a complex exponential signal;
   first and second filters responsive to the frequency shifted baseband signal and signal images from said complex modulator to generate frequency shifted filtered baseband signal and signal images;
   a phase shifting circuit responsive to the frequency shifted filtered baseband signal and signal images from said second filter to generate phase and frequency shifted filtered baseband signal and signal images; and a combiner circuit for combining the frequency shifted filtered baseband signal and signal images from said first filter with the phase and frequency shifted filtered baseband signal and signal images from said phase shifting circuit for suppressing the signal images and isolating the frequency shifted baseband signal.

22. The image-canceling quadrature modulator of claim 21 wherein said complex modulator multiplies the baseband signal and signal images by a complex exponential signal, $e^{j\omega_0 n}=\cos(\omega_0 n)+j\sin(\omega_0 n)$, wherein $\omega_0$ is a carrier frequency.

23. The image-canceling quadrature modulator of claim 21 wherein said complex modulator multiplies the baseband signal and signal images by a complex exponential signal, $e^{j\omega_0 t}=\cos(\omega_0 t)+j\sin(\omega_0 t)$, wherein $\omega_0$ is a carrier frequency.

24. The image-canceling quadrature modulator of claim 21 wherein said phase shifting circuit implements a phase shift of 90°.

25. The image-canceling quadrature modulator of claim 21 wherein said first filter includes a delay.

26. The image-canceling quadrature modulator of claim 21 wherein said second filter is a Hilbert transform filter.

27. An image-canceling quadrature modulator comprising:

a complex modulator responsive to a complex carrier signal, the complex carrier signal including a baseband signal and signal images, for frequency shifting the baseband signal and signal images to generate frequency shifted baseband signal and signal images, said complex modulator multiplying the baseband signal and signal images by a complex exponential signal;

a first filter responsive to the frequency shifted baseband signal and signal images from said complex modulator to generate frequency shifted filtered baseband signal and signal images;

a phase shifting circuit responsive to the frequency shifted baseband signal and signal images from said complex modulator to generate phase and frequency shifted baseband signal and signal images;

a second filter responsive to the phase and frequency shifted baseband signal and signal images from said phase shifting circuit to generate phase and frequency shifted filtered baseband signal and signal images; and a combiner circuit for combining the frequency shifted filtered baseband signal and signal images from said first filter with the phase and frequency shifted filtered baseband signal and signal images from said second filter for suppressing the signal images and isolating the frequency shifted baseband signal.

28. The image-canceling quadrature modulator of claim 27 wherein said complex modulator multiplies the baseband signal and signal images by a complex exponential signal, $e^{j\omega_0 n}=\cos(\omega_0 n)+j\sin(\omega_0 n)$, wherein $\omega_0$ is a carrier frequency.

29. The image-canceling quadrature modulator of claim 27 wherein said complex modulator multiplies the baseband signal and signal images by a complex exponential signal, $e^{j\omega_0 t}=\cos(\omega_0 n)+j\sin(\omega_0 n)$, wherein $\omega_0$ is a carrier frequency.

30. The image-canceling quadrature modulator of claim 27 wherein said phase shifting circuit implements a phase shift of 90°.

31. The image-canceling quadrature modulator of claim 27 wherein said first filter includes a delay.

32. The image-canceling quadrature modulator of claim 27 wherein said second filter is a Hilbert transform filter.

33. An image-canceling quadrature modulator comprising:

a complex modulator responsive to a complex carrier signal, the complex carrier signal including a baseband signal and signal images, for frequency shifting the baseband signal and signal images to generate frequency shifted baseband signal and signal images, said complex modulator multiplying the baseband signal and signal images by a complex exponential signal; and a complex filter responsive to the frequency shifted baseband signal and signal images from said complex modulator for attenuating negative frequencies in the frequency shifted baseband signal and signal images.

34. The image-canceling quadrature modulator of claim 33 wherein said complex modulator multiplies the baseband signal and signal images by a complex exponential signal, $e^{j\omega_0 n}=\cos(\omega_0 n)+j\sin(\omega_0 n)$, wherein $\omega_0$ is a carrier frequency.

35. The image-canceling quadrature modulator of claim 33 wherein said complex modulator multiplies the baseband signal and signal images by a complex exponential signal, $e^{j\omega_0 t}=\cos(\omega_0 t)+j\sin(\omega_0 t)$, wherein $\omega_0$ is a carrier frequency.

* * * * *